US005265315A

United States Patent [19]

Hoisington et al.

[11] Patent Number: 5,265,315

[45] Date of Patent: Nov. 30, 1993

[54] METHOD OF MAKING A THIN-FILM TRANSDUCER INK JET HEAD

[75] Inventors: Paul A. Hoisington, Norwich, Vt.; Edward R. Moynihan, Plainfield; David W. Gailus, Nashua, both of N.H.

[73] Assignee: Spectra, Inc., Hanover, N.H.

[21] Appl. No.: 615,893

[22] Filed: Nov. 20, 1990

[51] Int. Cl.$^5$ .............................................. H01L 41/22

[52] U.S. Cl. ...................................... 29/25.35; 29/611; 29/890.1; 427/100

[58] Field of Search .................... 29/25.35, 890.1, 611; 346/140 R, 140 IJ; 427/100; 310/800, 359, 365, 366

[56] References Cited

U.S. PATENT DOCUMENTS 4,584,590 4/1986 Fischbeck et al. ............. 346/140 R
4,680,595 7/1987 Cruz-Uribe et al. ............ 346/140 R
4,700,203 10/1987 Yamamuro et al. ............ 310/800 X
4,825,227 4/1989 Hoisington et al. ............ 310/359 X

*Primary Examiner*—Carl E. Hall
*Attorney, Agent, or Firm*—Brumbaugh, Graves, Donohue & Raymond

[57] ABSTRACT

A thin-film transducer ink jet head is prepared by oxidizing one surface of a silicon wafer to provide a dielectric layer, forming electrodes on the layer by photoresist processing techniques, depositing one or more layers of PZT material to provide a thin-film piezoelectric layer having a thickness in the range of 1-25 microns, forming another pattern of electrodes on the surface of the PZT layer by photoresist techniques, and selectively etching the silicon substrate in the region of the electrodes to provide an ink chamber. Thereafter, an orifice plate is affixed to the substrate to enclose the ink chambers and provide an ink orifice for each of the chambers. An ink jet head having chambers 3.34 mm long by 0.17 mm wide by 0.15 mm deep and orifices spaced by 0.305 mm is provided.

19 Claims, 2 Drawing Sheets

METHOD OF MAKING A THIN-FILM TRANSDUCER INK JET HEAD

BACKGROUND OF THE INVENTION

This invention relates to ink jet heads having piezoelectric transducers for use in ink jet systems and, more particularly, to a new and improved ink jet head having a thin-film piezoelectric transducer.

In certain ink jet systems, the ink jet head contains ink chambers in which one wall or wall portion is provided by a plate-like piezoelectric element which moves laterally so as to expand or contract the volume of the chamber in response to electrical signals. Heretofore, such plate-like piezoelectric transducers have consisted of a continuous sheet of piezoelectric material forming the transducers for a series of adjacent ink jet chambers, as described, for example, in the Fischbeck et al. U.S. Pat. No. 4,584,590, or of individual plate-like piezoelectric elements disposed adjacent to each ink jet chamber, as disclosed, for example, in the Cruz-Uribe et al. U.S. Pat. No. 4,680,595. Moreover, as described in the Cruz-Uribe et al. patent, the individual transducers may, for example, be formed by etching to remove material from a single continuous sheet of piezoelectric material, leaving separate discrete transducers. Such conventional sheet-form piezoelectric materials are made, for example, by shaping green material into sheet form and firing, and they have a minimum thickness of about 3-5 mils (75-125 microns).

Because the extent of bending of a piezoelectric sheet material for a given applied voltage application is inversely proportional to the thickness of the sheet, the use of transducers having a minimum thickness of about 5 mils (125 microns) requires an ink chamber with a relatively large piezoelectric wall area in order to eject an ink drop of specific size, such as 80 picoliters. As a result of the large chamber wall area requirement, correspondingly large chamber size and orifice spacing, as well as ink jet head size, are required.

Sheet piezoelectric materials have further innate disadvantages in manufacturability. The materials tend to be fragile, which makes processing expensive. In addition, the sheet material must be bonded to at least one other part, which is generally a demanding process.

SUMMARY OF THE INVENTION

Accordingly, it is an object of the present invention to provide a new and improved ink jet head which overcomes the above-mentioned disadvantages of the prior art.

Another object of the invention is to provide an ink jet head having a piezoelectric transducer which is capable of larger deflection for a given voltage than prior art transducers.

A further object of the invention is to provide an ink jet head having a plurality of ink jet chambers in a closely-spaced array and corresponding orifices with smaller spacing than conventional ink jet heads.

Still another object of the invention is to provide an ink jet head having a piezoelectric transducer of reduced thickness so as to provide increased bending for a given voltage application.

Yet another object of the invention is to provide an ink jet head having a chamber-forming semiconductor transducer substrate which enables integration of electronic components for operation of the ink jet head.

An additional object of the invention is to provide a new and improved method for making an ink jet head in a simple and convenient manner to provide improved characteristics.

These and other objects of the invention are attained by forming one or more electrodes on a substrate, forming a thin film of piezoelectric material on the electrode, and forming one or more electrodes on the opposite surface of the thin film of piezoelectric material. Preferably, the substrate is an etchable material and a portion of the substrate is removed by etching to produce an ink jet chamber for which the electroded piezoelectric thin-film material forms one wall portion. In a preferred embodiment, an array of adjacent ink jet chambers is formed in a semiconductor substrate containing integrated circuit components and the thin film of piezoelectric material provides the transducers for all of the ink jet chambers, an orifice plate being affixed to the opposite side of the substrate to provide an orifice for each ink jet chamber.

Preferably, the etchable substrate is a silicon substrate of the type used in preparing integrated circuit chips, and the circuitry and components used to actuate the piezoelectric elements, such as drive pulse switches and memory elements, are formed on the surface of the substrate in accordance with the usual semiconductor integrated circuit processing techniques. Similarly, the electrodes for both sides of the thin-film piezoelectric layer are preferably applied in accordance with semiconductor integrated circuit technology using, for example, a photoresist material to define the electrode patterns for opposite surfaces of the transducer prior to and after deposition of the thin-film piezoelectric material.

In order to provide a thin-film layer of piezoelectric material having sufficient strength to eject ink in response to application of the desired potential while avoiding cracking of the film during preparation or subsequent thereto, the film is preferably formed by depositing one or more layers of piezoelectric material using conventional thin-film techniques, such as sol-gel, sputtering or vapor deposition. In order to create a desirable small, uniform grain structure in the piezoelectric layer, the film is preferably fired and annealed with a rapid thermal annealing technique.

BRIEF DESCRIPTION OF THE DRAWINGS

Further objects and advantages of the invention will be apparent from a reading of the following description in conjunction with the accompanying drawings in which.

DESCRIPTION OF PREFERRED EMBODIMENTS

Figure 1A:
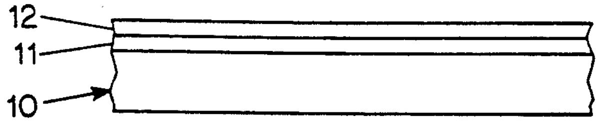
FIGS. 1(*a*)-1(*f*) are schematic cross-sectional illustrations showing the successive stages in a typical process for preparing a thin-film piezoelectric transducer and ink jet chamber in accordance with one embodiment of the present invention.
Figure 1B:
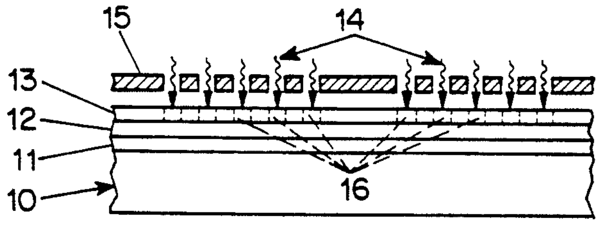
Figure 1C:
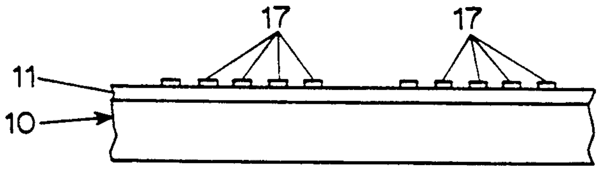
Figure 1D:
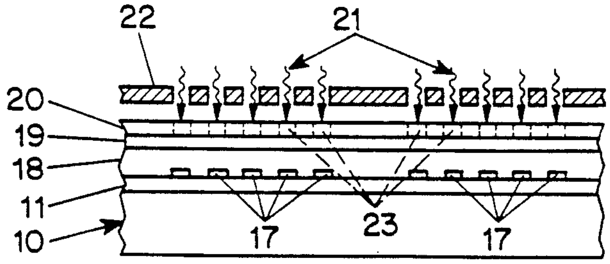
Figure 1E:
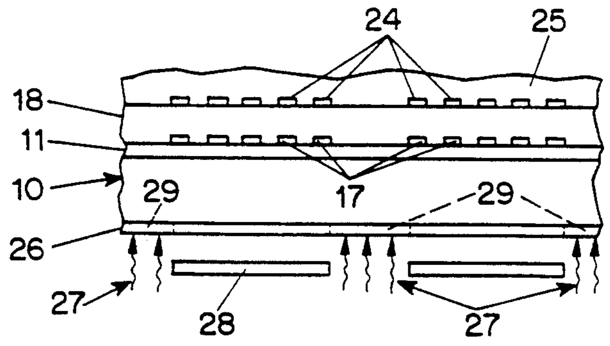
Figure 1F:
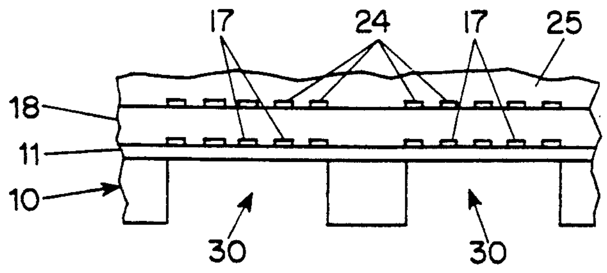

A typical process for preparing an ink jet head having ink chambers with a thin-film piezoelectric transducer in accordance with the invention is illustrated in FIGS. 1(*a*)–2(*f*). In FIG. 1(*a*), an etchable semiconductor substrate 10, such as an N-type silicon substrate wafer with a [1,1,0] crystal orientation having a thickness of about 6 mils (150 microns) is first oxidized in steam at 1000° C. in the usual manner to form a 2500Å-thick silicon oxide layer 11 which will act as a dielectric and an etch barrier. For use as an ink chamber plate in a hot melt ink jet head, silicon provides desirable mechanical, electrical and thermal properties and is a highly suitable substrate for thin-film deposition and photoresist processes. It also permits the incorporation of suitable system control components on the same substrate by integrated circuit techniques as described hereinafter. To enable etching of the substrate a [1,1,0] crystal orientation is desirable.

Thereafter, a layer 12 of conductive material about 0.2 micron thick is applied to the silicon oxide layer. The conductive layer 12 may be a sputtered or a vacuum-evaporated aluminum, nickel, chromium or platinum layer or an indium tin oxide (ITO) layer deposited by a conventional sol gel process.

As shown in FIG. 1(*b*), a conventional photoresist layer 13, spin-coated on the conductive layer 12, is exposed by ultraviolet rays 14 through a mask 15 and developed to harden the resist layer 12 in selected regions 16 in accordance with a conductor pattern which is to be provided on one side of the piezoelectric layer. The unhardened photoresist is removed, the exposed metal layer 12 is etched in the usual manner, and the photoresist is stripped off, leaving a conductive electrode pattern 17 on the layer 11, as shown in FIG. 1(*c*).

A thin film 18 of lead zirconium titanate (PZT) piezoelectric material is applied to the electroded substrate 10 by the sol gel process described, for example, in the publication entitled "Preparation of $Pb(ZrTi)O_3$ Thin Films by Sol Gel Processing: Electrical, Optical, and Electro-Optic Properties" by Yi, Wu and Sayer in the *Journal of Applied Physics*, Vol. 64, No. 5, 1 Sep. 1988, pp. 2717–2724. While the PZT film strength increases with increasing thickness, the magnitude of the PZT bending in response to a given applied voltage decreases with increasing thickness, as described above. Accordingly, the film thickness should be the minimum necessary to withstand the stresses applied to the film during ink jet operation. For ink jet systems having orifice and ink chamber sizes in the general range described herein, and using inks having operating viscosities in the range of about 1–40 cps, the PZT film should have a thickness in the range of about 1–25 microns, preferably about 2–10 microns, and, desirably, about 3–5 microns. If the film thickness is greater than a few microns, the film is preferably prepared by depositing it in several layers, each from 0.1 to 5 microns thick depending on the sol-gel solution used, to avoid cracking of the film and to assure a small perovskite grain size.

The coated substrate is then fired at about 600° C. to create a solution of the PZT components, cooled, and finally annealed. Preferably, rapid thermal annealing is used to reduce the cycle time and to assure a small, uniform grain structure necessary for good mechanical performance. This may be accomplished by heating the coated substrate at a rate of about 100° C. per second to approximately 600° C. and maintaining it at that temperature for about 10 seconds, after which the coated substrate is cooled to room temperature in about 30 seconds by inert gas circulation. This provides a uniform, small PZT grain size of about 0.3 microns.

The PZT film 18 is then coated with another layer 19 of conductive material, such as aluminum, nickel, chromium, platinum or ITO, and, as illustrated in FIG. 1(*d*), a photoresist layer 20 is coated on the conductive layer and then exposed to ultraviolet rays 21 through a mask 22 and developed to produce hardened regions 23. Thereafter, the unhardened photoresist is removed and the exposed portion of the conductive layer 19 is etched to provide a pattern of electrodes on the upper side of the PZT film 18 corresponding to the hardened regions 23. The resulting upper electrode pattern 24 is shown in FIG. 1(*e*). Following formation of the electrode pattern 24, a protective layer 25 of polyimide material is spin-coated on the top surface of the PZT layer to protect that layer and the electrode pattern.

In certain transducer arrangements with interdigitated electrodes, as described in the copending Hoisington et al. Application Ser. No. 07/615,898, filed Nov. 10, 1990, electrodes are required on only one surface of the piezoelectric film. In such cases, the step of forming electrode patterns on one side of the film may be eliminated.

In order to produce the ink chambers which are to be acted upon by the PZT layer, the opposite side of the silicon substrate 10 is coated with a photoresist layer 26 and exposed to ultraviolet light rays 27 through a mask 28 and developed to provide a pattern of hardened photoresist regions 29. The unhardened photoresist is then removed and the exposed silicon is etched down to the silicon oxide layer 11 to produce a pattern of ink chamber cavities 30, as shown in FIG. 1(*f*).

After the ink chambers 30 have been formed, the polyimide coating 25 on the top surface is removed by etching at locations where electrical contacts are to be made to the top electrodes, and both the polyimide layer and the PZT film are etched away in locations where contacts to the bottom electrodes are desired. Gold is then sputtered through a mask onto these locations so that wire bonds or pressure contacts may be used for electrical connections and an orifice plate is bonded to the lower surface of the substrate 10 to close the ink chambers and provide an orifice for each chamber in the usual manner. By appropriate energization of the electrode patterns 17 and 24, the thin-film piezoelectric transducer layer 18 may be selectively deformed in each chamber 30 in the usual manner so as to eject ink from the chamber through the corresponding orifice.

Figure 2:
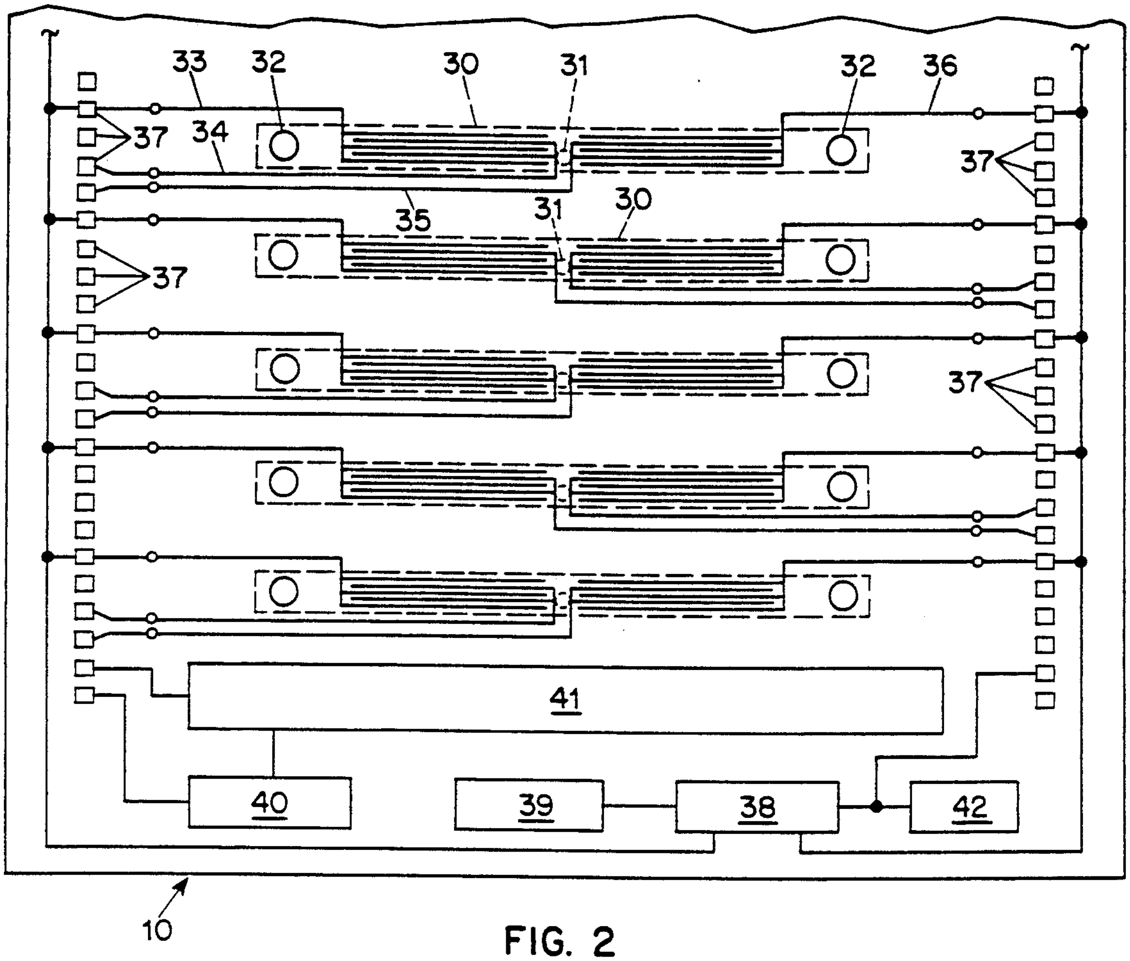
FIG. 2 is a schematic diagram showing a representative circuit arrangement for controlling the operation of an ink jet head and containing electrodes formed on one surface of a semiconductor substrate for a thin-film piezoelectric transducer.

FIG. 2 illustrates schematically a representative conductor pattern applied to the upper surface of a coated substrate to energize the electrode patterns 24 opposite each of the ink chambers 30. In the top plan view shown in FIG. 2, the elongated shape of each of the ink chambers 30 in the underlying substrate is illustrated in dotted outline as are the orifices 31, which are centrally positioned with respect to each ink chamber, and two ink supply apertures 32, one at each end of each ink chamber, which are connected to an ink supply (not shown).

In the schematic representation of a typical embodiment shown in FIG. 2, selected electrodes in each of the patterns 24 are connected through corresponding conductors 33, 34, 35 and 36 to appropriate contact regions 37 aligned adjacent to the edges of the substrate 10 and exposed to permit bonding of wires or engagement by pressure contacts. A corresponding conductor pattern is provided beneath the PZT layer to supply potential to the underlying electrode patterns 17 (which are not illustrated in FIG. 2) from appropriate contact regions 37.

If the substrate 10 is a silicon wafer of the type used in semiconductor processing, various ink jet system control components may be provided on the same substrate using conventional semiconductor integrated circuit processing technology. Such components may include a transducer drive unit 38 containing conventional switches and other electronic components required to supply the appropriate electrical pulses to actuate the transducer elements, a nonvolatile memory unit 39 containing semiconductor storage elements to store information relating, for example, to calibration of the ink jet head to provide appropriate firing times and pulse amplitudes for the ink jet system in which it is used, a temperature-sensing and control unit 40 and a related thin-film heating element 41 to detect and maintain the correct temperature for proper operation of the ink jet head, and a drop counter 42 to count drops of each type of ink ejected by the ink jet head and provide a warning or shut-off signal when an ink supply is nearly depleted.

In a typical ink jet system utilizing thin-film piezoelectric transducers of the type described herein, a single silicon substrate may be formed with a series of adjacent ink chambers approximately 3.34 mm long, 0.17 mm wide and 0.15 mm deep and spaced by about 0.13 mm so as to provide a spacing between adjacent orifices of about 0.3 mm. With this arrangement, a 300-line per inch (11.8-line per Mm) image can be obtained by orienting the angle of the aligned orifices at 33.7° to the scan direction. Moreover, a silicon substrate containing 48 ink jets with associated drivers, memory and temperature-control circuitry can be provided on a single chip measuring about 10 mm by 15 mm.

Figure 3:
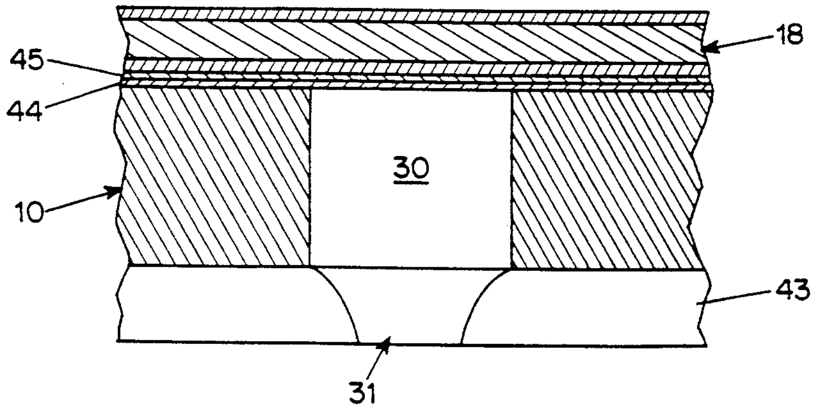
FIG. 3 is an enlarged cross-sectional view showing an ink jet chamber with a thin-film piezoelectric transducer in accordance with another embodiment of the invention.

In an alternative structure illustrated in the enlarged view of FIG. 3, a silicon substrate 10 having an orifice plate 43 affixed to the lower surface to provide an orifice 31 for each chamber 30 is coated on the upper surface with a thin metal barrier layer 44 of platinum, nickel or the like about 0.2 microns thick and a dielectric layer 45 of aluminum oxide, also about 0.2 microns thick, is applied over the metal barrier layer. Thereafter, the electrode patterns and the PZT film 18 are applied in the manner described above with respect to FIG. 1. With this arrangement, the PZT film is effectively protected from attack by constituents of the ink contained in the chamber 30.

Moreover, the thin-film piezoelectric transducer described herein need not be combined with a silicon substrate which is etched to form the ink chambers. Instead, if desired, after the thin-film transducer and associated electrodes have been prepared in the manner described herein, the upper surface of the assembly may be affixed to another substrate having the desired ink chamber pattern and the silicon substrate may be etched away. With this arrangement, the thin-film PZT may be further protected by an optional intervening membrane or other flexible support member interposed between the PZT film and the new substrate containing the ink chambers. In addition, if the silicon substrate is removed entirely, two thin-film PZT transducer layers may be mounted on opposite sides of a membrane, which is then mounted on another substrate containing the desired ink jet chamber pattern, thereby increasing the ejection pressure available for a given applied voltage. As another alternative, multiple layers of thin-film PZT transducer and associated electrode patterns may be applied in succession to the same substrate to produce increased displacement of the transducer for a given applied voltage.

Although the invention has been described herein with reference to specific embodiments, many modifications and variations therein will readily occur to those skilled in the art. Accordingly, all such variations and modifications are included within the intended scope of the invention.

We claim:

1. A method for making an ink jet transducer comprising providing a substrate, depositing an inorganic piezoelectric film on the substrate, and firing the inorganic piezoelectric film to form a layer having a thickness between about 1 and about 25 microns, and forming at least one electrode pattern adjacent to a surface of the piezoelectric film to provide a transducer element.

2. A method according to claim 1 including separating the transducer element from the substrate and applying the transducer element to a membrane.

3. A method according to claim 1 including applying the transducer element to a second substrate and removing at least a part of the substrate on which the transducer element was formed.

4. A method according to claim 1 including the step of removing a portion of the substrate to provide a chamber adjacent to a region of the transducer element containing at least one electrode.

5. A method according to claim 4 including the step of affixing an orifice plate to the side of the substrate opposite the transducer element to enclose the chamber and provide an orifice communicating with the chamber.

6. A method according to claim 1 wherein the piezoelectric film is formed by depositing at least two successive layers of piezoelectric material on the substrate.

7. A method according to claim 6 wherein each of the successive layers deposited to form the piezoelectric film has a thickness from about 0.1 to about 5 microns.

8. A method according to claim 1 including annealing the piezoelectric film after deposition on the substrate.

9. A method according to claim 1 wherein the substrate is suitable for solid state circuitry fabrication.

10. A method according to claim 9 including forming a transducer drive circuit for the ink jet head on the substrate.

11. A method according to claim 9 including forming a memory circuit for the ink jet head on the substrate.

12. A method according to claim 9 including forming a temperature control element for the ink jet head on the substrate.

13. A method according to claim 9 including forming a thin-film heater for the ink jet head on the substrate.

14. A method according to claim 9 including forming a drop ejection pulse control element for the ink jet head on the substrate.

15. A method according to claim 9 including forming a drop counter circuit for ink supply detection on the substrate.

16. A method according to claim 9 wherein the substrate is silicon.

17. A method according to claim 1 wherein the thickness of the piezoelectric film is in the range from about 2 to about 10 microns.

18. A method according to claim 1 wherein the thickness of the piezoelectric film is in the range from about 3 to about 5 microns.

19. A method according to claim 1 including the step of forming at least one electrode adjacent to the other surface of the piezoelectric film.

* * * * *